US012457783B2

(12) United States Patent
Bao et al.

(10) Patent No.: US 12,457,783 B2
(45) Date of Patent: Oct. 28, 2025

(54) SELECTIVE CONTACT ON SOURCE AND DRAIN

(71) Applicant: QUALCOMM Incorporated, San Diego, CA (US)

(72) Inventors: Junjing Bao, San Diego, CA (US); Xia Li, San Diego, CA (US); Chih-Sung Yang, Hsinchu (TW); Kwanyong Lim, San Diego, CA (US); Ming-Huei Lin, New Taipei (TW); Hyunwoo Park, San Diego, CA (US); Haining Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 403 days.

(21) Appl. No.: 18/189,442

(22) Filed: Mar. 24, 2023

(65) Prior Publication Data

US 2024/0321965 A1    Sep. 26, 2024

(51) Int. Cl.
| | | |
|---|---|---|
| *H10D 62/13* | (2025.01) | |
| *H01L 21/768* | (2006.01) | |
| *H10D 64/01* | (2025.01) | |
| *H10D 84/01* | (2025.01) | |
| *H10D 84/03* | (2025.01) | |
| *H10D 84/83* | (2025.01) | |

(52) U.S. Cl.
CPC ..... *H10D 62/151* (2025.01); *H01L 21/76841* (2013.01); *H10D 64/021* (2025.01); *H10D 84/013* (2025.01); *H10D 84/0147* (2025.01); *H10D 84/038* (2025.01); *H10D 84/83* (2025.01)

(58) Field of Classification Search
CPC .. H10D 62/151; H10D 64/021; H10D 84/013; H10D 84/0147; H10D 84/038; H10D 84/83
See application file for complete search history.

(56) References Cited

U.S. PATENT DOCUMENTS

| | | |
|---|---|---|
| 11,233,134 B2 | 1/2022 | Chu et al. |
| 2021/0193816 A1* | 6/2021 | Chu ................... H10D 84/0193 |
| 2022/0367269 A1 | 11/2022 | Lin et al. |

OTHER PUBLICATIONS

International Search Report and Written Opinion—PCT/US2024/017697—ISA/EPO—Jul. 12, 2024.
Luoh T., et al., "Advanced Tungsten Plug Process for Beyond Nanometer Technology", Microelectronic Engineering, Elsevier Publishers BV., Amsterdam, NL, vol. 85, No. 8, Aug. 1, 2008, pp. 1739-1747, XP023172025, the whole document.

\* cited by examiner

*Primary Examiner* — Fernando L Toledo
*Assistant Examiner* — Adam S Bowen
(74) *Attorney, Agent, or Firm* — Muncy, Geissler, Oids & Lowe, P.C./Qualcomm Incorporated

(57) ABSTRACT

Disclosed are devices that include a contact for electrical connection with a source/drain. The contact occupies a full width of a contact well other than areas occupied by sidewall spacers. As a result, high resistivity (due to the presence of liners and nucleation layers within the contact well in conventional devices) is reduced or eliminated.

29 Claims, 15 Drawing Sheets

SELECTIVE CONTACT ON SOURCE AND DRAIN

FIELD OF DISCLOSURE

This disclosure relates generally to semiconductor devices, and more specifically, but not exclusively, to semiconductor devices with selective contact, such as tungsten contact, on sources and/or drains, and fabrication techniques thereof.

BACKGROUND

Integrated circuit (IC) technology has achieved great strides in advancing computing power through miniaturization of active components. Unfortunately, source/drain (S/D) contact resistance has become higher due to high resistivity from titanium nitride (TiN) and tungsten (W) nucleation layers. High resistivity portion is becoming higher when contact critical dimension scales, which leads to degradation in chip performance.

Accordingly, there is a need for systems, apparatus, and methods that overcome the deficiencies of conventional devices including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary device is disclosed. The device may comprise a source/drain (S/D) formed in a substrate. The device may also comprise a silicide formed in the substrate. The silicide may be above and electrically coupled with the S/D. The device may further comprise a nucleation layer formed in the substrate. The nucleation layer may be above and electrically coupled with the silicide. The device may yet comprise a dielectric formed on an upper surface of the substrate. The dielectric may have a contact well that exposes an upper surface of the nucleation layer. The device may yet further comprise sidewall spacers formed on sides of the dielectric defining the contact well. The device may still comprise a contact formed within the contact well. The contact may be in direct contact with the sidewall spacers and electrically coupled with the silicide.

A method of fabricating a device is disclosed. The method may comprise forming a source/drain (S/D) in a substrate. The method may also comprise forming a silicide in the substrate. The silicide may be above and electrically coupled with the S/D. The method may further comprise forming a nucleation layer in the substrate. The nucleation layer may be above and electrically coupled with the silicide. The method may yet comprise forming a dielectric on an upper surface of the substrate. The dielectric may have a contact well that exposes an upper surface of the nucleation layer. The method may yet further comprise forming sidewall spacers on sides of the dielectric defining the contact well. The method may still comprise forming a contact within the contact well. The contact may be in direct contact with the sidewall spacers and electrically coupled with the silicide.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
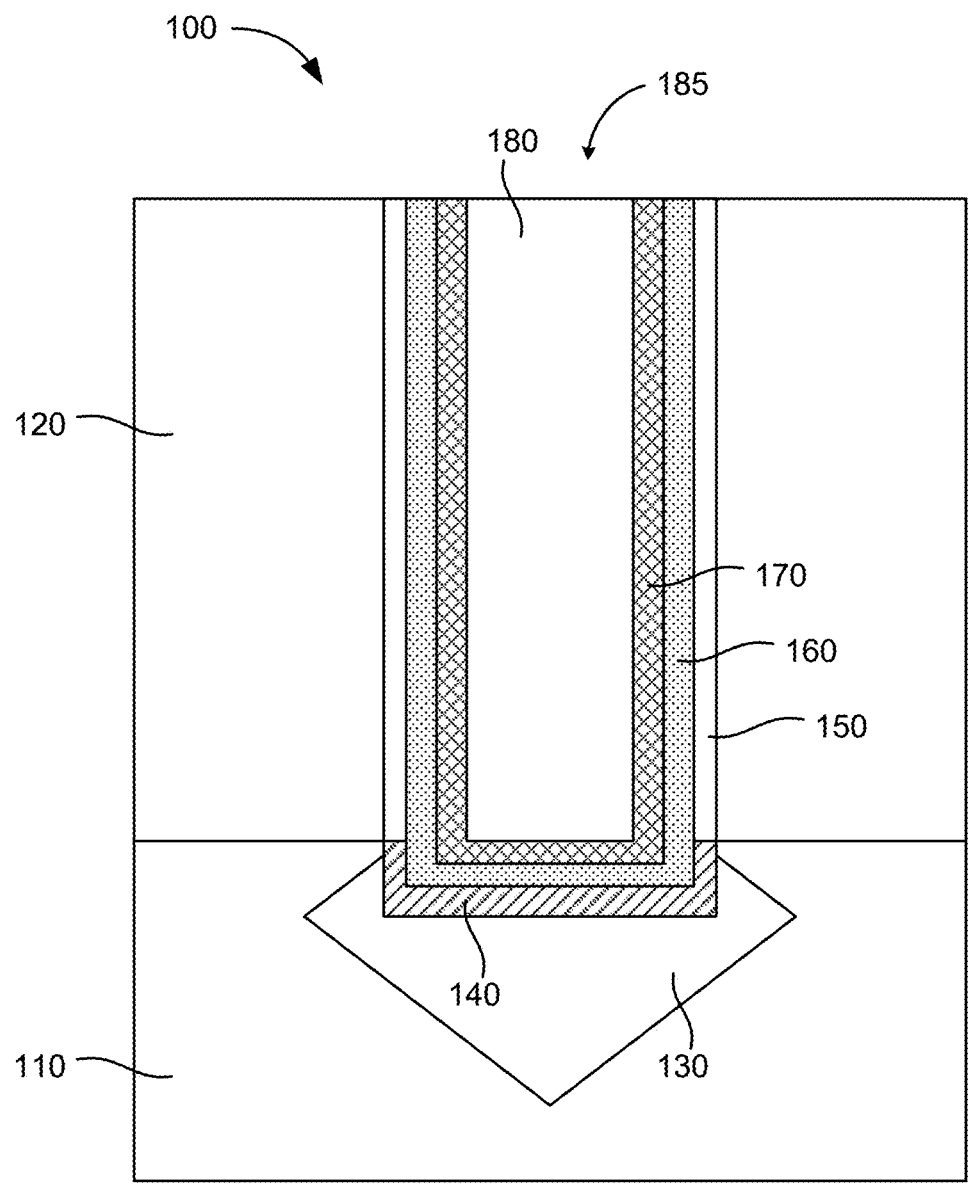
FIG. 1 illustrate an example of a conventional device with a selective contact.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising." "includes," and/or "including." when used herein, specify the presence of stated features, integers, steps, operations, elements, and/or components, but do not preclude the presence or addition of one or more other features, integers, steps, operations, elements, components, and/or groups thereof.

As indicated above, source/drain (S/D) contact resistance has become higher due to high resistivity from nucleation layers. High resistivity portion is becoming higher when contact critical dimension scales, which leads to degradation in chip performance.

FIG. 1 illustrate an example of a conventional device 100 with a tungsten contact. The conventional device 100 includes a silicon (Si) substrate 110 and a silicon nitride ($SiO_2$) dielectric 120 on the Si substrate 110. A source/drain (S/D) 130 and a titanium silicide (TiSi) 140 is formed within the Si substrate 110.

Within the $SiO_2$ dielectric 120, a contact well 185 that exposes the TiSi 140 is defined. Sidewall spacers 150 are formed on the sides of the $SiO_2$ dielectric 120 defining the contact well 185. A 'U' shaped titanium nitride (TiN) liner 160 is formed on the sidewall spacers 150 within the contact well 185 and on the TiSi 140. Also, a 'U' shaped tungsten (W) nucleation layer 170 is formed on the TiN liner 160 within the contact well 185. Finally, a tungsten (W) contact 180 is formed on the W nucleation layer 170, and thus filling in the remaining portion of the contact well 185.

Combined lateral widths of the TiN liner 160, the W nucleation layer 170, and the tungsten contact 180 can be referred to as a critical dimension (CD), and the CD is continuously getting smaller and smaller. Typically, the widths of the vertical portions of the TiN liner 160 and of the W nucleation layer 170 each range between 1-2 nm. This means that as the CD gets smaller and smaller, the TiN liner 160 and the W nucleation layer 170 occupy a larger proportion of the CD, and the tungsten contact 170 occupies a smaller proportion of the CD.

Unfortunately, the TiN liner 160 and of the W nucleation layer 170 both have high resistances. As a result, as the proportion of the CD occupied by the TiN liner 160 and of the W nucleation layer 170 gets larger, the resistivity between the tungsten contact 180 and the S/D 130 undesirably increases.

To address these and other issues of the conventional device, it is proposed to provide devices with selective contacts without liners and/or nucleation layers on sidewalls of contact wells. In this way, proportion of the CD occupied by the conductive selective contact is maximized. As a result, resistivity between the selective contact and the source/drain can be minimized, which can enhance performance of devices.

Figure 2A:
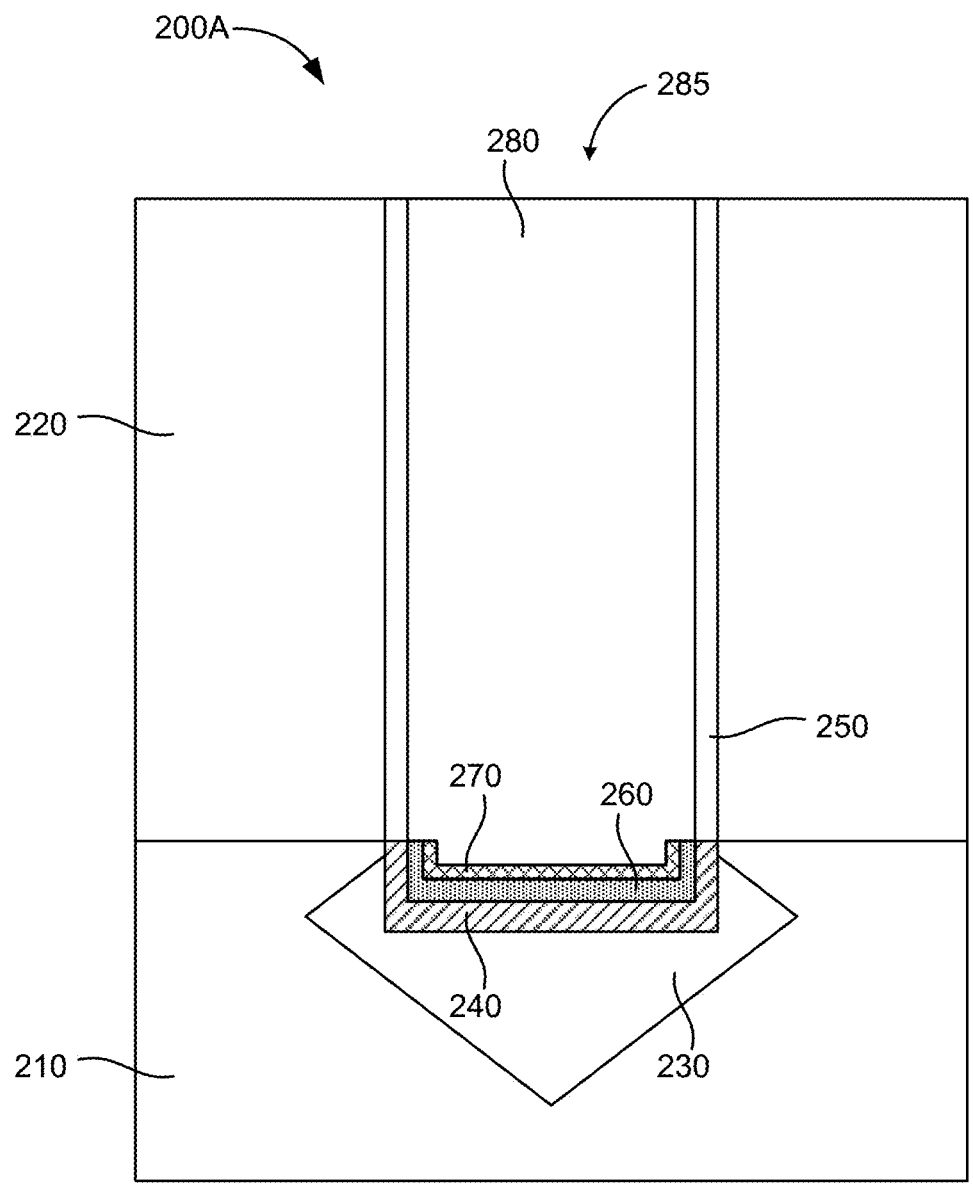
FIGS. 2A and 2B illustrate examples of devices with selective contacts in accordance with at one or more aspects of the disclosure.

FIG. 2A illustrates an example of a device with a selective contact in accordance with one or more aspects of the disclosure. As seen, the device 200A of FIG. 2A may include a substrate 210 and a dielectric 220 formed on an upper surface of the substrate 210. In an aspect, the substrate 210 may be formed from silicon (Si), and the dielectric 220 may be formed from silicon oxide (e.g., $SiO_2$). Before proceeding further, it should be noted that terms such as "upper", "lower", "top", "bottom", "left", "right", etc. are used for case of description. Unless specifically indicated, these should not be taken to specify an absolute orientation.

A source/drain (S/D) 230 may be formed in the substrate 210. In an aspect, the S/D 230 may be an epitaxial S/D 230.

A conductive silicide 240 may also be formed in the substrate 210. In an aspect, the conductive silicide 240 may be a titanium silicide (TiSi). The conductive silicide 240 may be above and electrically coupled with the S/D 230. In an aspect, the conductive silicide 240 may be in direct contact with the S/D 230. Below the upper surface of the substrate 210, the conductive silicide 240 may take on a 'U' shape comprising side portions and a lower portion.

A liner layer 260 may be formed in the substrate 210 such that the conductive silicide 240 is between the S/D 230 and the liner layer 260. The liner layer 260 may be a titanium nitride (TiN) liner layer. The liner layer 260 helps to protect the conductive silicide 240 from oxidation. In an aspect, the liner layer 260 may be in direct contact with the conductive silicide 240. The liner layer 260 may take on a shape that is conformal to the shape of the conductive silicide 240. That is, the liner layer 260 may also be 'U' shaped comprising side portions and a lower portion. For example, the liner layer 260 may be formed through atomic layer deposition, which enables the liner layer 260 to follow the shape of the conductive silicide 240. The outer surfaces of the side portions of the liner layer 260 may be in contact with the inner surfaces of the side portions of the conductive silicide 240. Alternatively or in addition thereto, a lower surface of the lower portion of the liner layer 260 may be in contact with an upper surface of the lower portion of the conductive silicide 240.

The liner layer 260 may be between the conductive silicide 240 and a nucleation layer 270, which may be formed in the substrate 210. The nucleation layer 270 may be formed from conductive materials such as tungsten (W), cobalt (Co), ruthenium (Ru), nickel (Ni), niobium (Nb), etc. The nucleation layer 270 may be electrically coupled with the conductive silicide 240. In an aspect, the nucleation layer 270 may be in direct contact with the liner layer 260. The nucleation layer 270 may take on a shape that is conformal to the shape of the liner layer 260. That is, the nucleation layer 270 may also be 'U' shaped comprising side portions and a lower portion. Again, atomic layer deposition process may enable the nucleation layer 270 to follow the shape of the liner layer 260. The outer surfaces of the side portions of the nucleation layer 270 may be in contact with the inner surfaces of the side portions of the liner layer 260. Alternatively or in addition thereto, a lower surface of the lower portion of the nucleation layer 270 may be in contact with an upper surface of the lower portion of the liner layer 260.

The upper surfaces of the side portions of the conductive silicide 240 and/or of the liner layer 260 and/or of the nucleation layer 270 may be coplanar with the upper surface of the substrate 210. Alternatively or in addition thereto, upper surfaces of the conductive silicide 240 and/or of the liner layer 260 and/or of the nucleation layer 270 may be below the upper surface of the substrate 210.

Within the dielectric 220, a contact well 285 that exposes an upper surface of the nucleation layer 270 may be defined. In particular, the contact well 285 may be defined by inner sides of the dielectric 220. Sidewall spacers 250 may be formed on the sides of the dielectric 220 defining the contact well 285. The sidewall spacers 250 may be formed from insulative nitrides, such as silicon nitride (SiN).

A selective contact 280 may be formed within the contact well 285. The selective contact 280 may be formed from conductive metals such as tungsten (W) through selective chemical vapor deposition. In an aspect, the selective contact 280 may be in direct contact with the sidewall spacers 250. That is, the selective contact 280 and the sidewall spacers 250 may entirely fill the contact well 285 within the dielectric 220. The selective contact 280 may be electrically coupled with the nucleation layer 270. For example, the selective contact 280 and the nucleation layer 270 may be in direct contact with each other. In an aspect, a lower surface of the selective contact 280 may be coplanar with a lower surface of the dielectric 220. There may be an electrical path formed between the selective contact 280 and the S/D 230 through the nucleation layer 270, the liner layer 260, and the conductive silicide 230.

Note that unlike the conventional device 100 of FIG. 1, there are no high resistivity elements—e.g., liner layer, nucleation layer, etc.—within the contact well 285. This means that proportion of the critical dimension (CD) occupied by the highly conductive selective contact 280 is maximized. This means that bulk resistivity due to the liner and nucleation layers within the contact well 285 is reduced or even eliminated altogether, which in turn can reduce the overall resistance between the selective contact 280 and the S/D 230. As a result, overall performance can be improved.

Figure 2B:
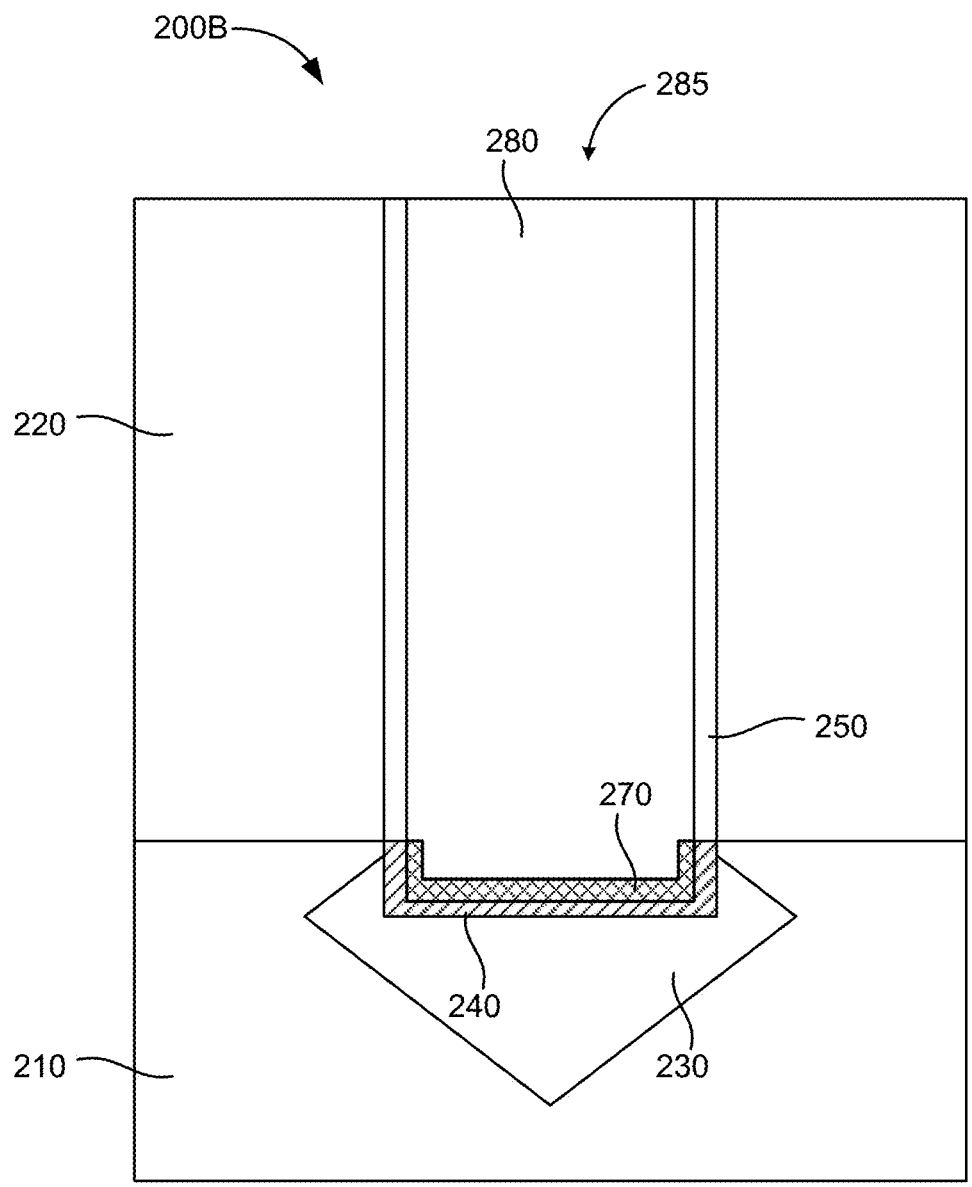

FIG. 2B illustrates another example of a device with a selective contact in accordance with one or more aspects of the disclosure. One difference between the device 200A of FIG. 2A and the device 200B of FIG. 2B is that the liner layer 260 is absent in the device 200B. Recall that one purpose of the liner layer 260 is to protect the conductive silicide 240 from oxidation. However, one technical disadvantage is that the liner layer 260 can present a significant interface resistivity. By removing the liner layer 260, the interface resistivity due to the liner layer 260 can be removed, and again, the overall resistance between the selective contact 280 and the S/D 230 can be reduced even more.

If the fabrication of the device 200B can be performed in a chamber with a break in the vacuum, then the conductive silicide 240 being subjected to oxidation can be minimized. In this instance, the nucleation layer 270 may be formed on the conductive silicide 240. As seen in FIG. 2B, the nucleation layer 270 may be in direct contact with the conductive silicide 240. For example, a lower surface of the nucleation layer 270 may be in direct contact with an upper surface of at least a portion of the conductive silicide 240. The conductive silicide 240 and the nucleation layer 270 may both be formed entirely within the substrate 210. In an aspect, an upper surface of the nucleation layer 270 may be below the upper surface of the substrate 210.

The selective contact 280 may extend to below the upper surface of the substrate 210, and be electrically coupled with the nucleation layer 270. For example, the selective contact 280 and the nucleation layer 270 may be in direct contact with each other.

The conductive silicide 240 may be 'U' shaped comprising side portions and a lower portion. The upper surfaces of the side portions may be coplanar with the upper surface of the substrate, and an upper surface of the lower portion may be below the upper surface of the substrate 210. The nucleation layer 270 may be between the selective contact 280 and the upper surface of the lower portion of the conductive silicide 240. The nucleation layer 270 may be electrically coupled with the conductive silicide 240. In an aspect, the nucleation layer 270 may be in direct contact with the conductive silicide 240. The nucleation layer 270 may take on a shape that is conformal to the shape of the conductive silicide 240. That is, the nucleation layer 270 may also be 'U' shaped comprising side portions and a lower portion. Atomic layer deposition process may enable the nucleation layer 270 to follow the shape of the conductive silicide 240. The outer surfaces of the side portions of the nucleation layer 270 may be in contact with the inner surfaces of the side portions of the conductive silicide 240. Alternatively or in addition thereto, a lower surface of the lower portion of the nucleation layer 270 may be in contact with an upper surface of the lower portion of the conductive silicide 240.

Figure 3:
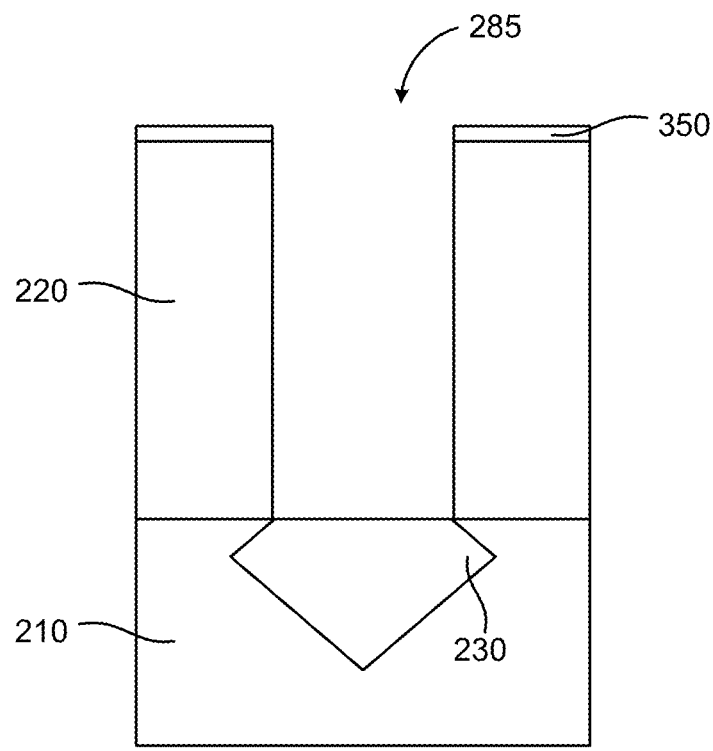
FIGS. 3-14B illustrate examples of stages of fabricating devices with selective contacts in accordance with at one or more aspects of the disclosure.

FIGS. 3-14B illustrate examples of stages of fabricating a device with a selective contact—such as the devices 200A, 200B-in accordance with at one or more aspects of the disclosure. FIG. 3 illustrates a stage in which first spacer 350 may be formed on upper surfaces of the dielectric 220. The first spacer 350 may have a first thickness, which may be between 5-10 nm. A chemical-vapor-deposition (CVD) process may be performed to form the second spacer 350. As seen, the dielectric 220 may be etched to form the contact well 285 to expose the S/D 230 formed within the substrate 210.

Figure 4:
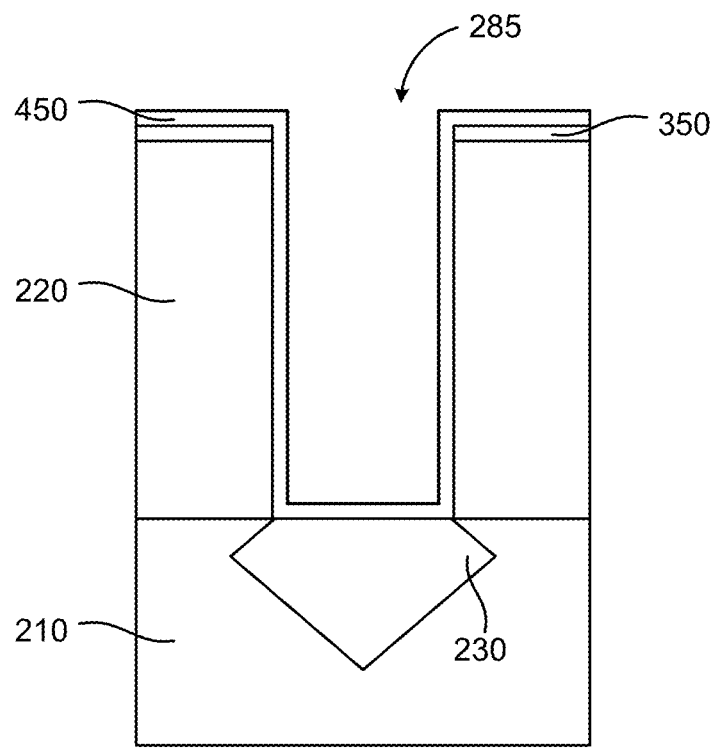

FIG. 4 illustrates a stage in which a second spacer 450 may be formed on the first spacer 350 and in the contact well 285. That is, the second spacer 450 may be formed on the exposed S/D 230 and on sides of the dielectric 220. The materials for the first and second spacers 350, 450 may be the same (e.g., SiN). The second spacer 450 may have a second thickness, which may be between 1-2 nm. A CVD process may be performed to form the second spacer 450.

Figure 5:
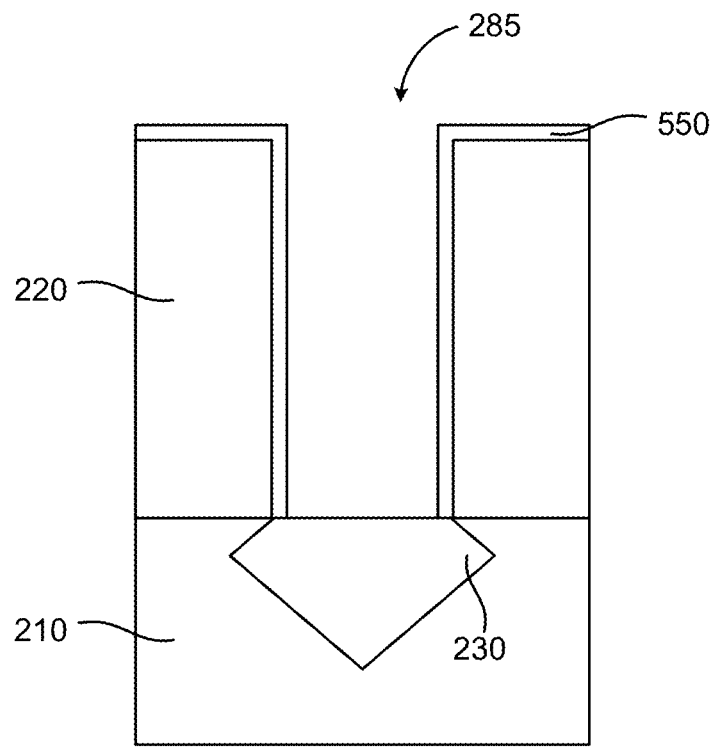

FIG. 5 illustrates a stage in which an anisotropic (i.e., directional) etching may be performed to remove a portion of the second spacer 450 at the bottom of the contact well 285 and to partially remove the portions of the second spacer 450 on the first spacer 350. The remaining spacer portions on the upper and side surfaces of the dielectric 220 are referred to as an intermediate spacer 550.

Figure 6:
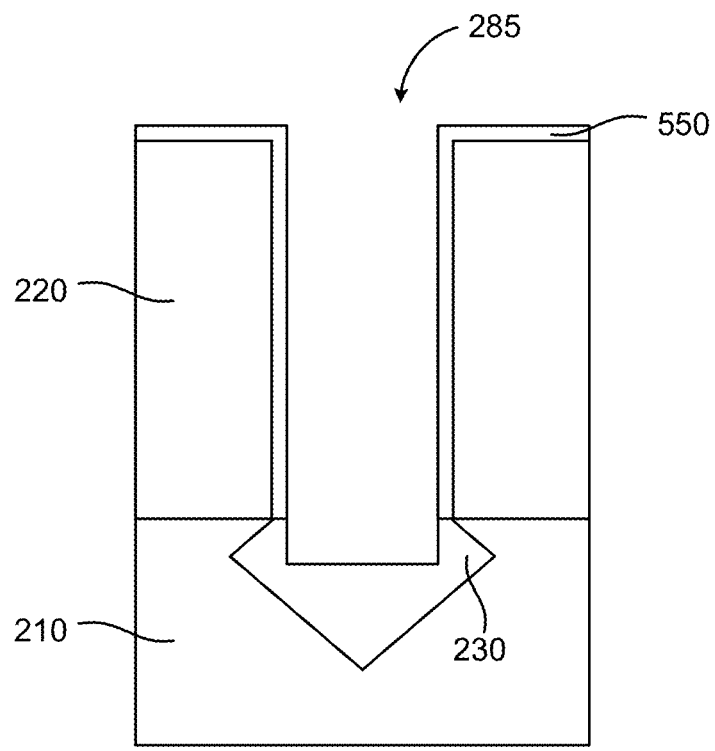

FIG. 6 illustrates a stage in which a recess is etched into the S/D 230. For ease of description, this may be viewed as extending the contact well 285 into the S/D 230.

Figure 7:
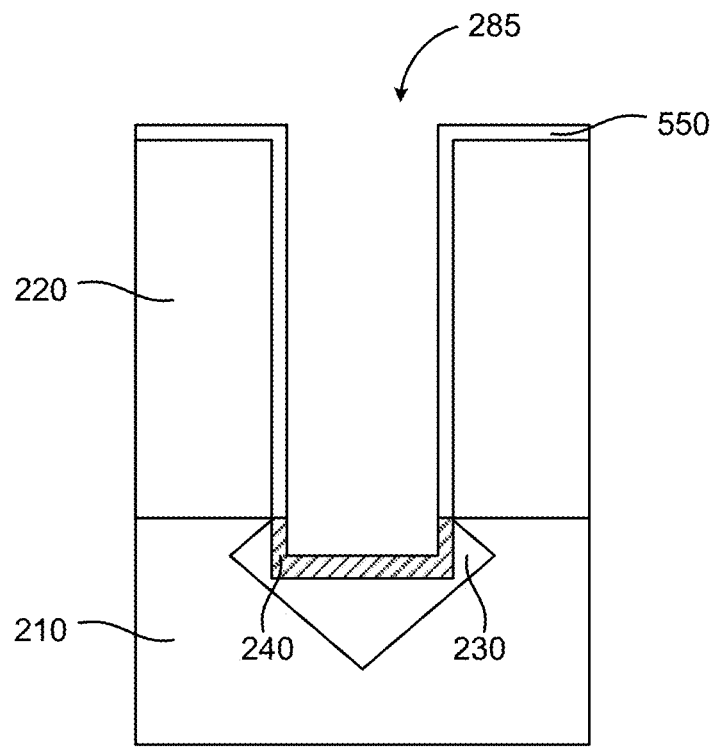

FIG. 7 illustrates a stage in which a conductive material—e.g., titanium (Ti)—may be deposited in the recess etched into the S/D 230 to form the conductive silicide 240. In an aspect, the conductive silicide 240 may be 'U' shaped.

Figure 8:
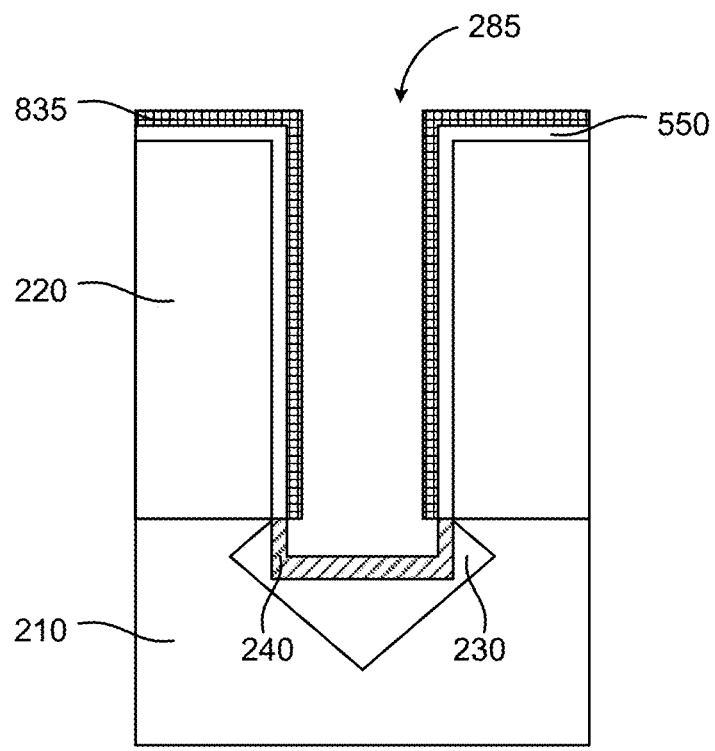

FIG. 8 illustrates a stage in which a self-assembled monolayer (SAM) 835 is selectively deposited on the intermediate spacer 550. In this instance, a SAM whose headgroup promotes selective growth of the chain on the dielectric 222 may be chosen as the SAM 835. An example of such SAM may be alkanethiols with (C-C)$^n$ chain. As a result, the SAM 835 may selectively grow on the intermediate spacer 550, but does not adhere to the bottom of the recess due to the lack of the intermediate spacer 550 in the recess. The SAM may be deposited through an electroless deposition process, a physical-vapor-deposition (PVD) process, etc.

Figure 9:
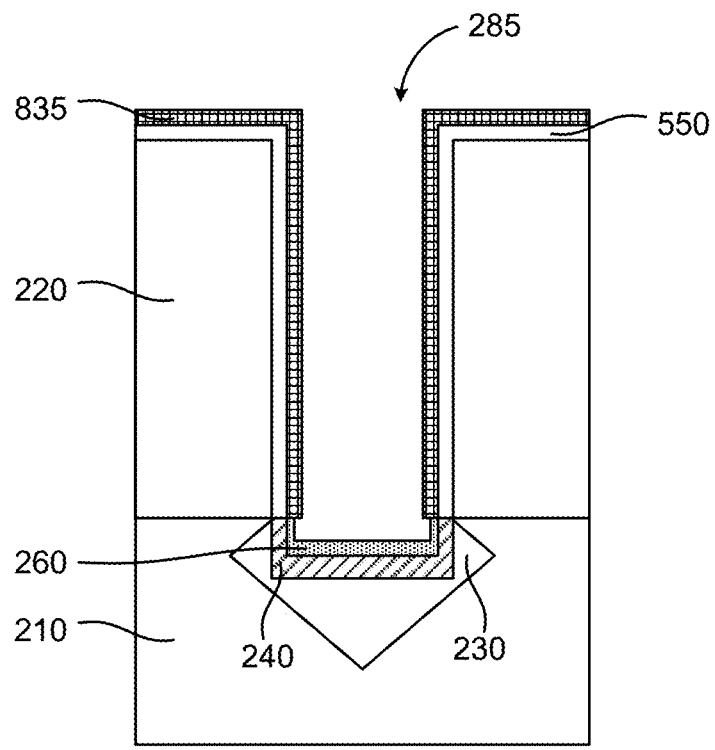

FIG. 9 illustrates a stage in which a liner material (e.g., titanium nitride (TiN)) is selectively deposited to form the liner layer 260 on the conductive silicide 240. The SAM 835 may prevent the liner material from adhering thereto. An atomic-layer-deposition (ALD) process may be performed to form the liner layer 260. As a result, the liner layer 260 may follow the shape of the conductive silicide, i.e., the liner layer 260 may also be 'U' shaped.

Figure 10:
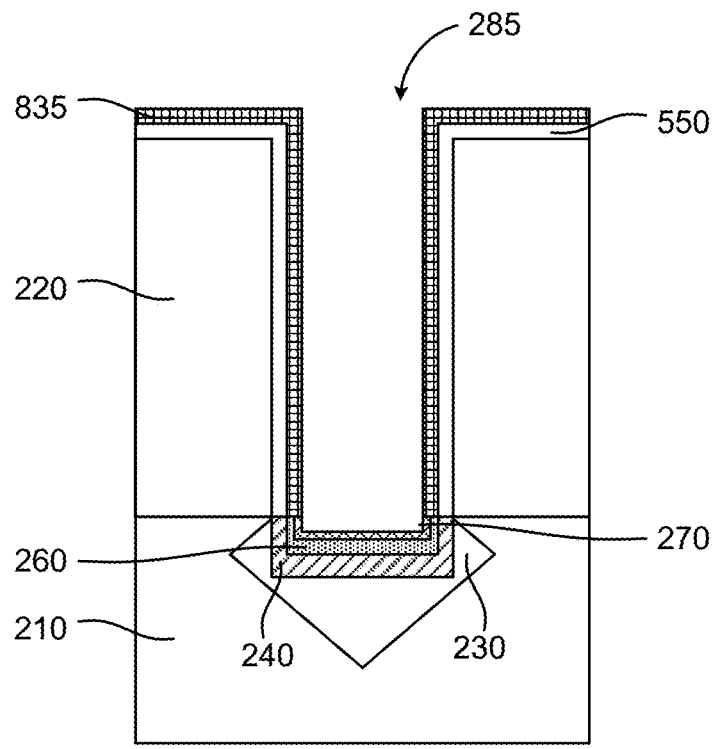

FIG. 10 illustrates a stage in which nucleation material (e.g., tungsten (W), cobalt (Co), ruthenium (Ru), nickel (Ni), niobium (Nb), etc.) may be selectively deposited to form the nucleation layer 270 on the liner layer 260. The SAM 835 may prevent the nucleation material from adhering thereto. An ALD process may be performed to form the nucleation layer 270, which may result in the nucleation layer 270 following the shape of the liner layer 260.

Figure 11:
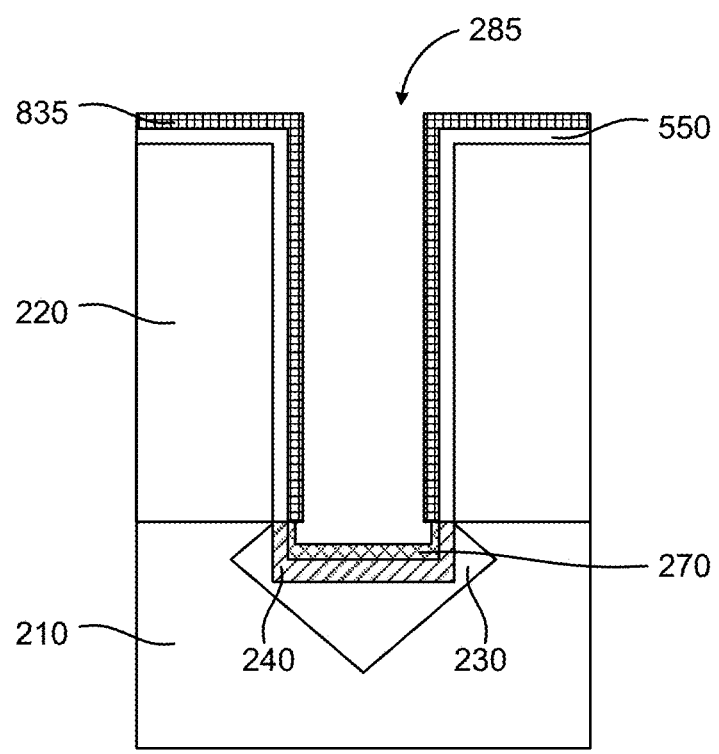

Recall that in the device 200B, there is no liner layer 260. Thus, FIG. 11 illustrates an alternative stage that may follow the stage of FIG. 8. The stage illustrated in FIG. 11 illustrates that the nucleation material (e.g., W, Co, Ru, Ni, Nb, etc.) may be selectively deposited to form the nucleation layer 270 on the conductive silicide 240. The SAM 835 may prevent the nucleation material from adhering thereto. An ALD process may be performed to form the nucleation layer 270, which may result in the nucleation layer 270 following the shape of the conductive silicide 240.

Figure 12A:
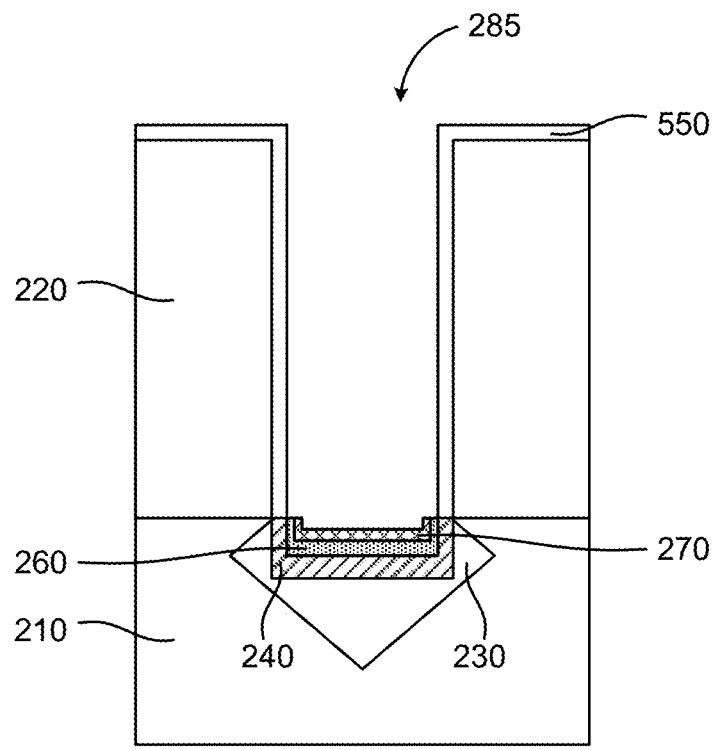
Figure 12B:
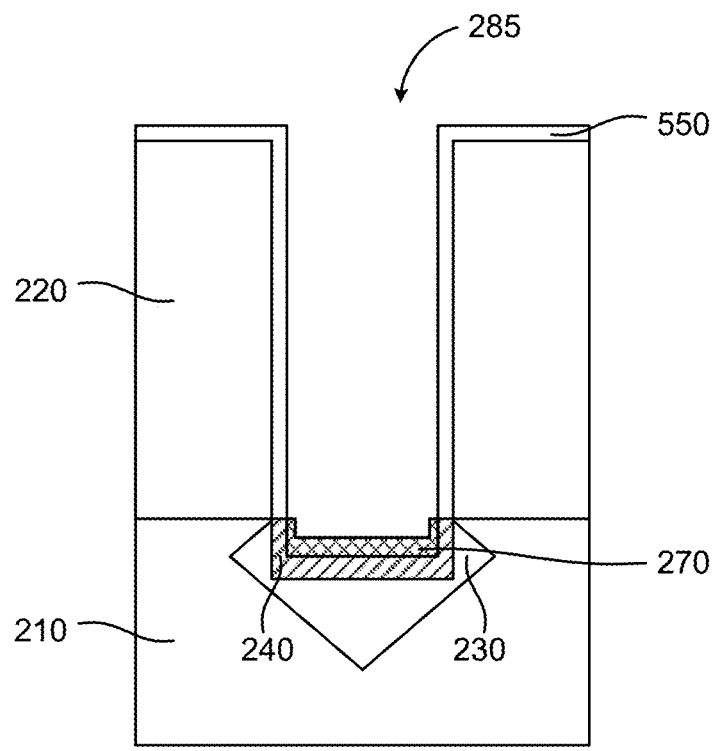

FIG. 12A illustrates a stage that may follow the stage of FIG. 10, and FIG. 12B illustrates a stage that may follow the stage of FIG. 11. In the stages of FIGS. 12A and 12B, the SAM 835 may be removed. For example, argon (Ar) and hydrogen (H) plasma treatment may be performed to remove the SAM 835.

Figure 13A:
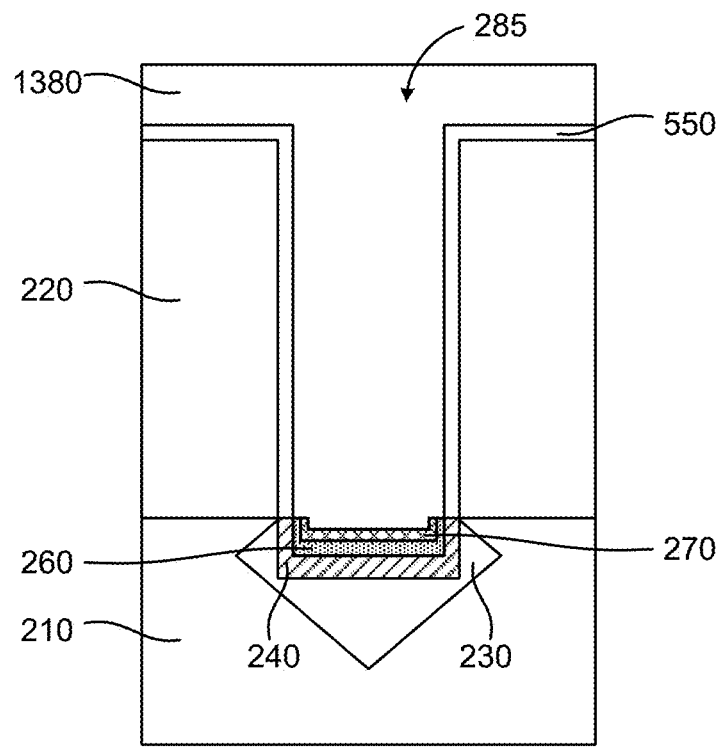
Figure 13B:
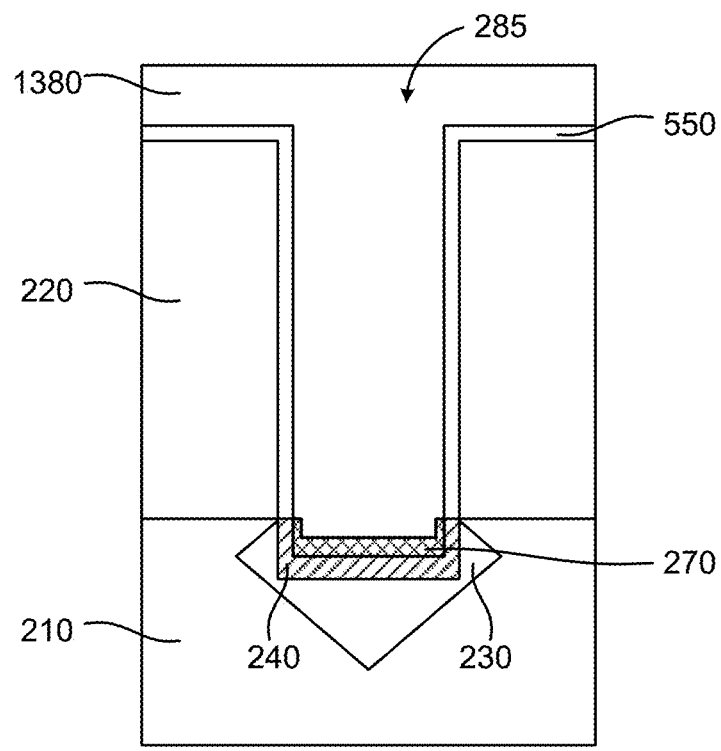

FIG. 13A illustrates a stage that may follow the stage of FIG. 12A, and FIG. 13B illustrates a stage that may follow the stage of FIG. 12B. In the stages of FIGS. 13A and 13B, a conductive material (e.g., W) may be selectively deposited in the contact well 285 and on the intermediate space 500. The nucleation layer 270 may promote selective growth of the conductive material. The conductive material may be over-deposited, i.e., over the upper surface of the dielectric 222.

Figure 14A:
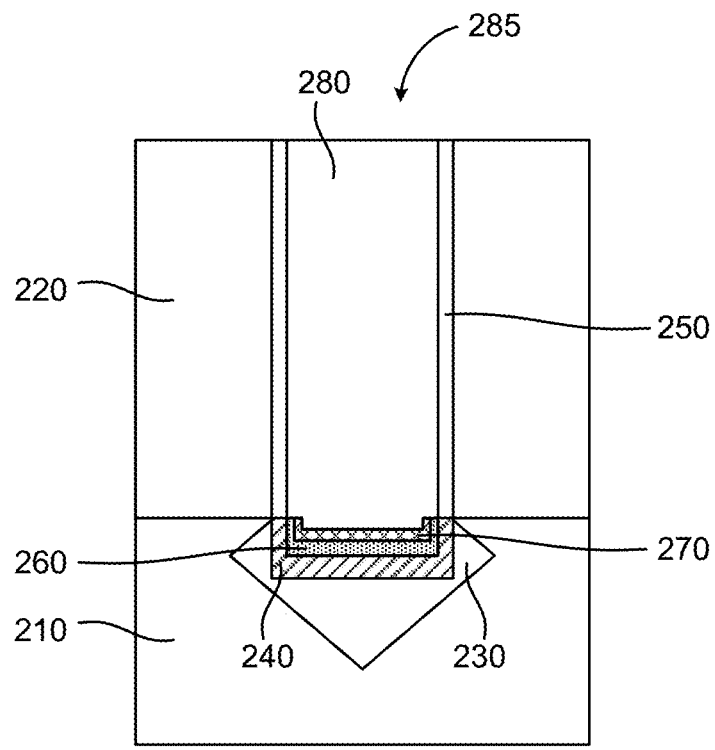
Figure 14B:
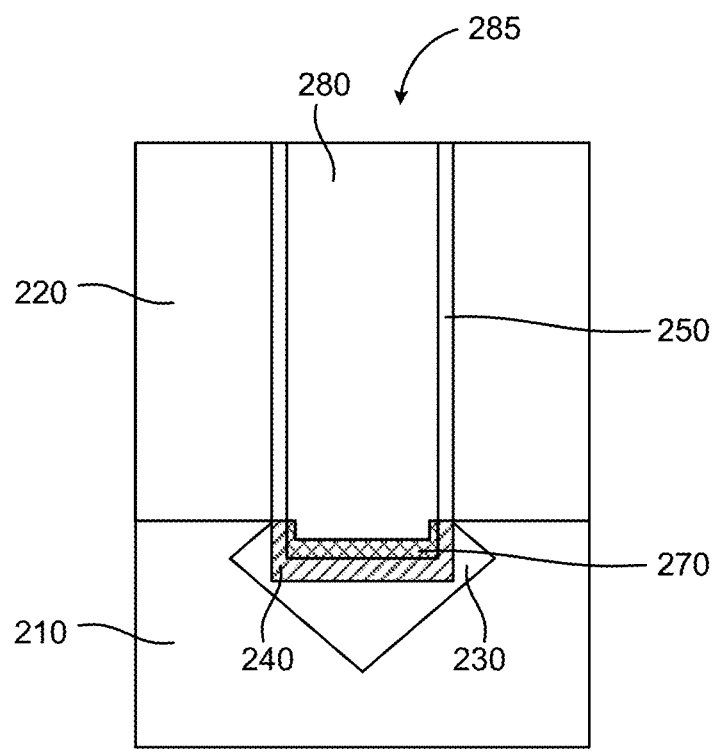

FIG. 14A illustrates a stage that may follow the stage of FIG. 13A, and FIG. 14B illustrates a stage that may follow the stage of FIG. 13B. In the stages of FIGS. 14A and 13B, the over-deposited conductive material may be removed, e.g., by chemical-mechanical polishing (CMP)—to form the selective contact 280.

Figure 15:
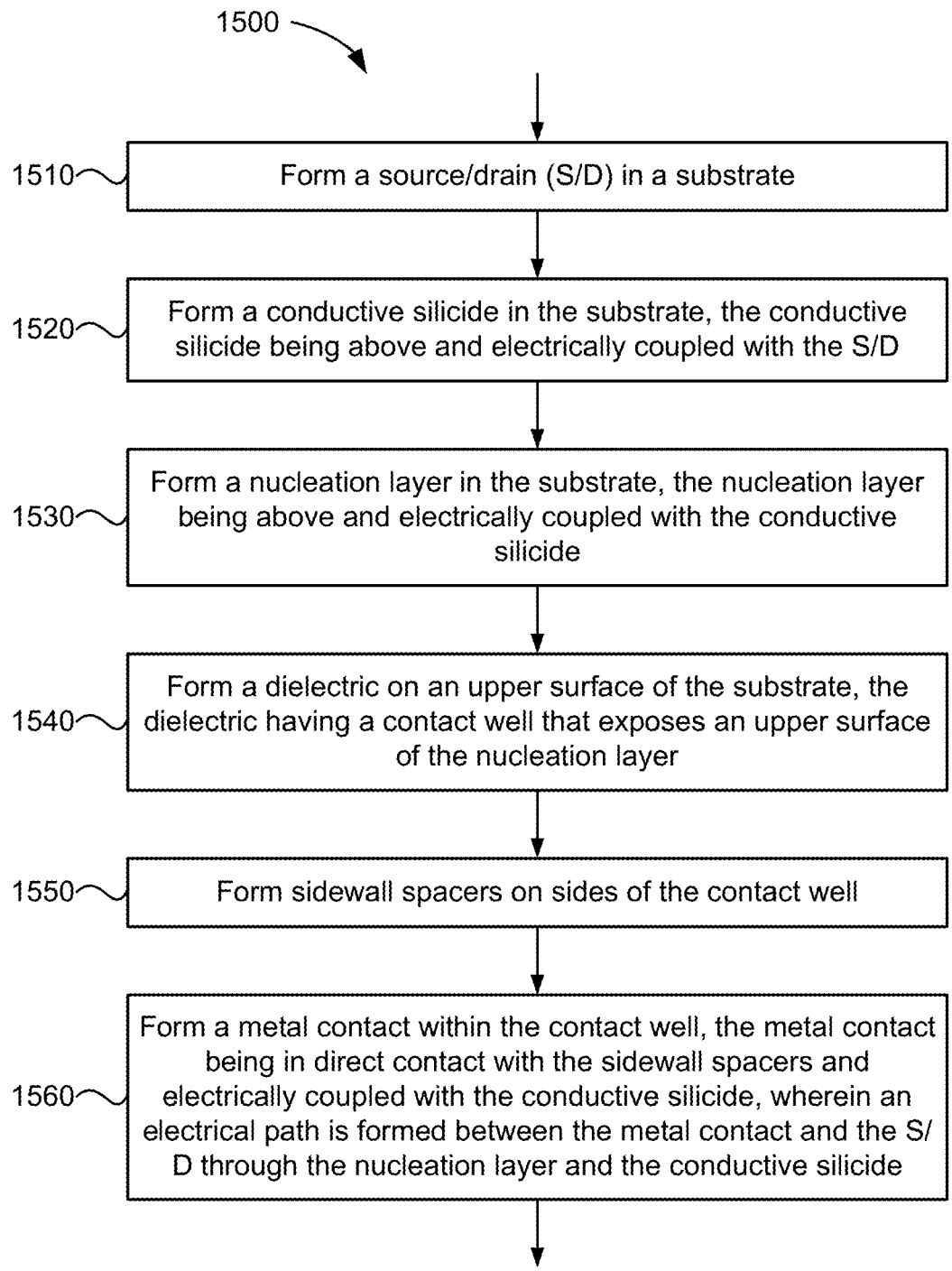
FIGS. 15-17 illustrate flow charts of example methods of manufacturing devices with selective contacts in accordance with at one or more aspects of the disclosure.

FIG. 15 illustrates a flow chart of an example method 1500 of fabricating a device with a selective contact, such as the devices 200A, 200B, in accordance with at one or more aspects of the disclosure.

In block 1510, a source/drain (S/D) 230 may be formed in a substrate 210. In an aspect, block 1510 may correspond to the stage illustrated in FIG. 3.

In block 1520, a conductive silicide 240 may be formed in the substrate 210. The conductive silicide 240 may be above and electrically coupled with the S/D 230. In an aspect, block 1520 may correspond to the stages illustrated in FIGS. 5-7.

In block 1530, a nucleation layer 270 may be formed in the substrate 210. The nucleation layer 270 may be above and electrically coupled with the conductive silicide 240. In an aspect, block 1530 may correspond to the stages illustrated in FIG. 11.

In block 1540, a dielectric 220 may be formed on an upper surface of the substrate 210. The dielectric 220 may have a contact well 285 that exposes an upper surface of the nucleation layer 270. In an aspect, block 1540 may correspond to the stage illustrated FIG. 3.

In block 1550, sidewall spacers 250 may be formed on sides of the dielectric 220 defining the contact well contact well 285. In an aspect, block 1550 may correspond to the stages illustrated in FIGS. 14A and 14B.

In block 1560, a selective contact 280 may be formed within the contact well 285. The selective contact 280 may be in direct contact with the sidewall spacers 250 and electrically coupled with the conductive silicide 240. An electrical path may be formed between the selective contact 280 and the S/D 230 through the nucleation layer 270 and the conductive silicide 240. In an aspect, block 1560 may correspond to the stages illustrated in FIGS. 13A-14B.

Figure 16:
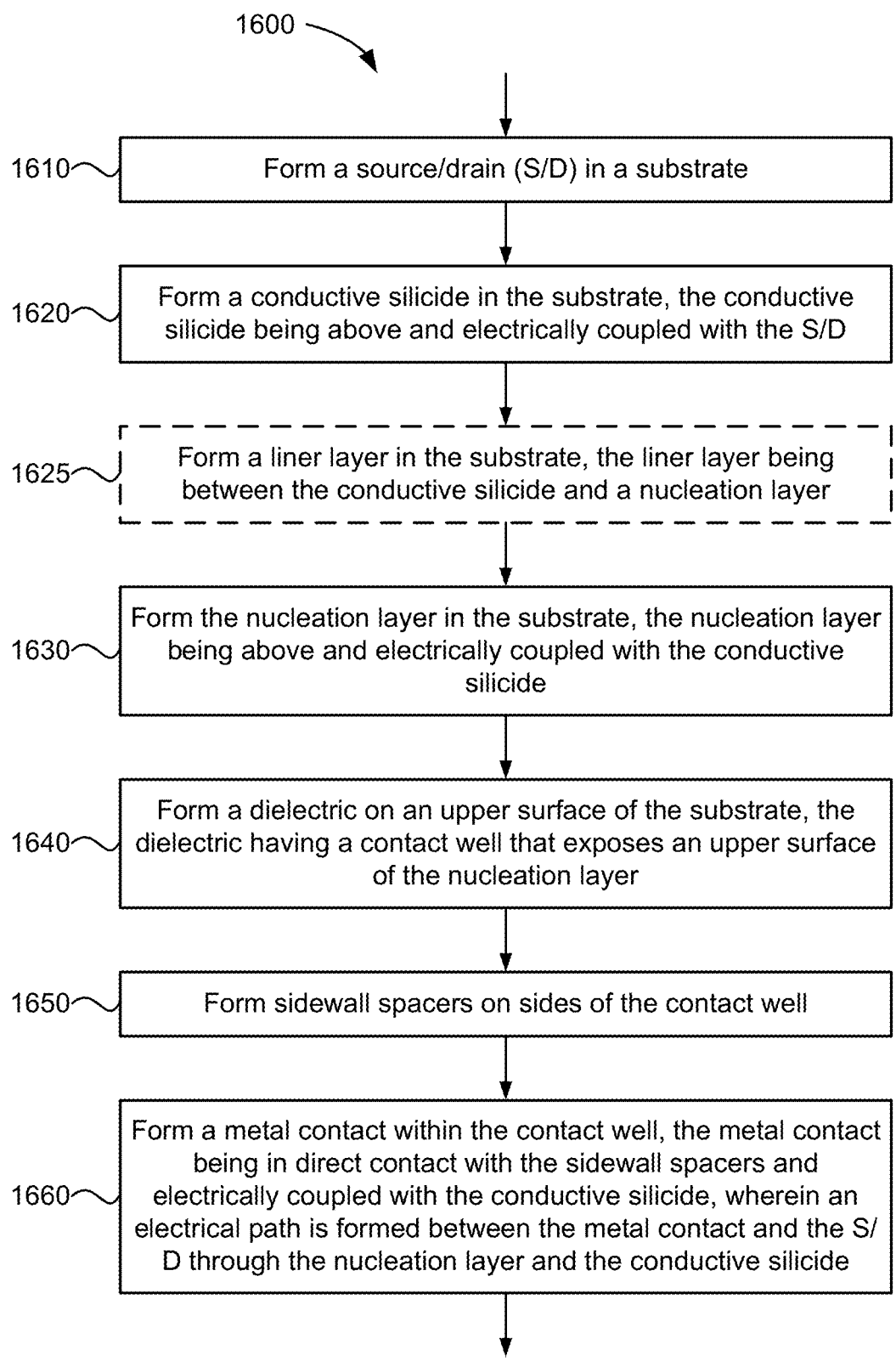

FIG. 16 illustrates a flow chart of an example method 1600 of fabricating a device with a selective contact, such as the devices 200A, 200B, in accordance with at one or more aspects of the disclosure. FIG. 16 may be view as being more comprehensive than FIG. 15.

Block 1610 may be similar to block 1510. That is, in block 1610, a source/drain (S/D) 230 may be formed in a substrate 210. In an aspect, block 1610 may correspond to the stage illustrated in FIG. 3.

Block 1620 may be similar to block 1520. That is, in block 1620, a conductive silicide 240 may be formed in the substrate 210. The conductive silicide 240 may be above and electrically coupled with the S/D 230. In an aspect, block 1620 may correspond to the stages illustrated in FIGS. 5-7.

In block 1625, a liner layer 260 may be formed in the substrate 210. The liner layer 260 may be between the conductive silicide 240 and a nucleation layer 270. Note that block 1625 is optional (as indicated by the dashed box). In an aspect, block 1625 may correspond to the stage illustrated in FIG. 9.

Block 1630 may be similar to block 1530. That is, in block 1630, the nucleation layer 270 may be formed in the substrate 210. The nucleation layer 270 may be above and electrically coupled with the conductive silicide 240. In an aspect, block 1630 may correspond to the stages illustrated in FIGS. 10 and 11.

Figure 17:
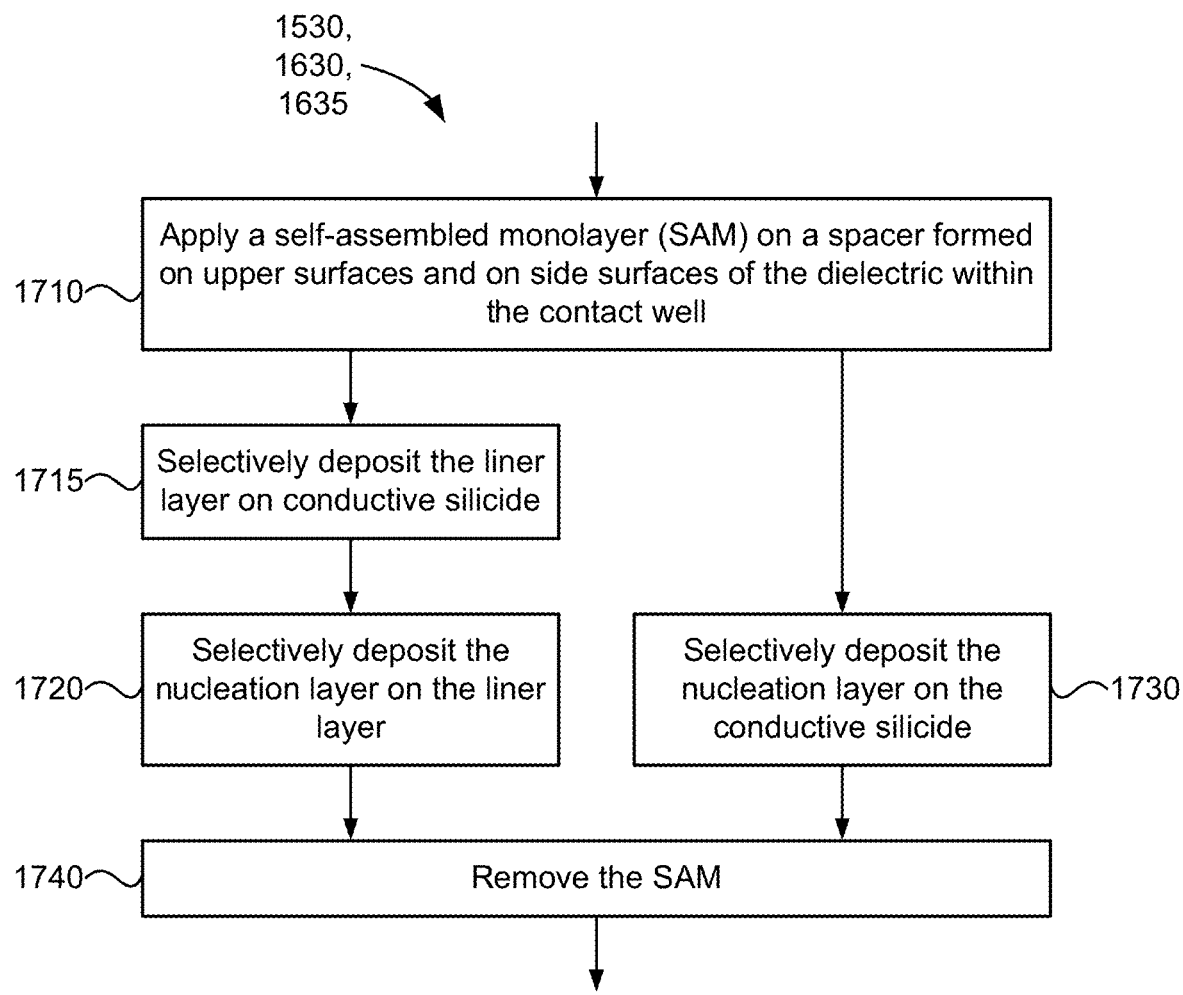

FIG. 17 illustrates a flow chart of a process to implement block 1530 or blocks 1630 and 1635 in accordance with one or more aspects of the present disclosure. In block 1710, a self-assembled monolayer (SAM) 835 may be formed on a spacer (e.g., intermediate spacer 550) formed on upper surfaces and on side surfaces of the dielectric 220 within the contact well 285. In an aspect, block 1710 may correspond to the stage illustrated in FIG. 8.

From block 1710, in block 1715, the liner layer 260 may be selectively deposited on the conductive silicide 240. In an aspect, block 1715 may correspond to the stage illustrated in FIG. 9.

From block 1715, in block 1720, the nucleation layer 270 may be selectively deposited on the liner layer 260. In an aspect, block 1720 may correspond to the stage illustrated in FIG. 10.

Alternatively from block 1710, in block 1730, the nucleation layer 270 may be selectively deposited on the conductive silicide 240. In an aspect, block 1730 may correspond to the stage illustrated in FIG. 11.

Either from block 1720 or from block 1730, in block 1740, the SAM 835 may be removed. In an aspect, block 1740 may correspond to the stage illustrated in FIGS. 12A and 12B.

Referring back to FIG. 16, block 1640 may be similar to block 1540. That is, in block 1640, a dielectric 220 may be formed on an upper surface of the substrate 210. The dielectric 220 may have a contact well 285 that exposes an upper surface of the nucleation layer 270. In an aspect, block 1640 may correspond to the stage illustrated FIG. 3.

Block 1650 may be similar to block 1550. That is, in block 1650, sidewall spacers 250 may be formed on sides of the dielectric 220 defining the contact well contact well 285. In an aspect, block 1650 may correspond to the stages illustrated in FIGS. 14A and 14B.

Block 1660 may be similar to block 1560. That is, in block 1660, a selective contact 280 may be formed within the contact well 285. The selective contact 280 may be in direct contact with the sidewall spacers 250 and electrically coupled with the conductive silicide 240. An electrical path may be formed between the selective contact 280 and the S/D 230 through the nucleation layer 270 and the conductive silicide 240. In an aspect, block 1660 may correspond to the stages illustrated in FIGS. 13A-14B.

Figure 18:
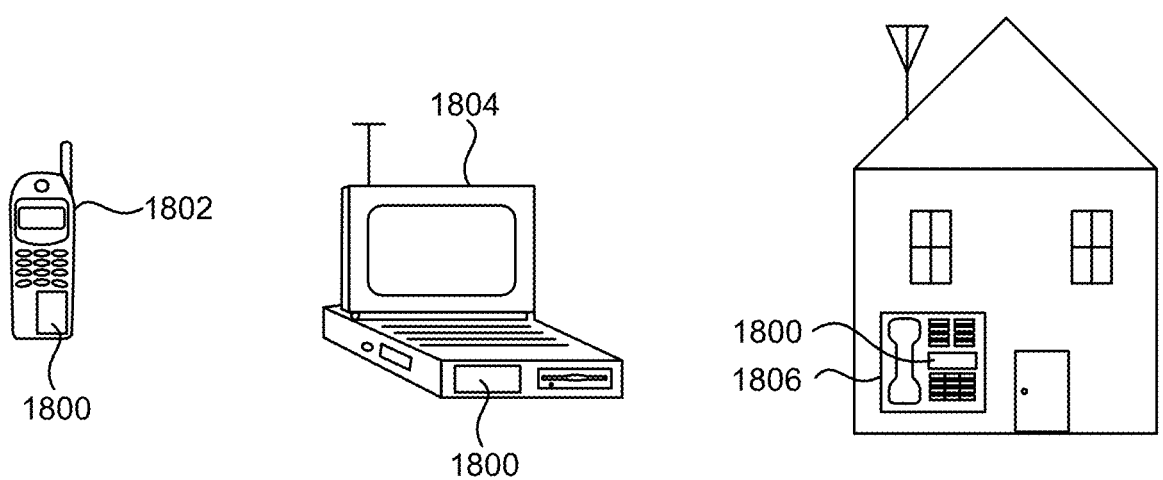
FIG. 18 illustrates various electronic devices which may utilize one or more aspects of the disclosure.

FIG. 18 illustrates various electronic devices 1800 that may be integrated with any of the aforementioned devices in accordance with various aspects of the disclosure. For example, a mobile phone device 802, a laptop computer device 804, and a fixed location terminal device 806 may each be considered generally user equipment (UE) and may include one or more devices (e.g., devices 200A, 200B) as described herein. The devices 802, 804, 806 illustrated in FIG. 18 are merely exemplary. Other electronic devices may also include the die packages including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A device, comprising: a source/drain (S/D) formed in a substrate; a silicide formed in the substrate, the silicide being above and electrically coupled with the S/D; a nucleation layer formed in the substrate, the nucleation layer being above and electrically coupled with the silicide; a dielectric formed on an upper surface of the substrate, the dielectric having a contact well that exposes an upper surface of the nucleation layer; sidewall spacers formed on sides of the dielectric defining the contact well; and a contact formed within the contact well, the contact being in direct contact with the sidewall spacers and electrically coupled with the silicide.

Clause 2: The device of clause 1, wherein the silicide and the nucleation layer are entirely within the substrate.

Clause 3: The device of any of clauses 1-2, further comprising: a liner layer formed in the substrate, the liner layer being between the silicide and the nucleation layer.

Clause 4: The device of clause 3, wherein the silicide is in direct contact with the S/D, or wherein the contact is in direct contact with the nucleation layer, or wherein the liner layer is in direct contact with one or both of the silicide and the nucleation layer, or any combination thereof.

Clause 5: The device of clause 4, wherein the silicide is 'U' shaped comprising side portions and a lower portion, upper surfaces of the side portions being coplanar with the upper surface of the substrate, and an upper surface of the lower portion being below the upper surface of the substrate, and wherein the liner layer is in direct contact with the silicide.

Clause 6: The device of clause 5, wherein the liner layer is 'U' shaped conformal to a shape of the silicide, the liner layer comprising side portions and a lower portion, and wherein outer surfaces of the side portions of the liner layer are in direct contact with inner surfaces of the side portions of the silicide, or a lower surface of the lower portion of the liner layer is in direct contact with the upper surface of the lower portion of the silicide, or both.

Clause 7: The device of clause 6, wherein the nucleation layer is 'U' shaped conformal to a shape of the liner layer, the nucleation layer comprising side portions and a lower portion, and wherein outer surfaces of the side portions of the nucleation layer are in direct contact with inner surfaces of the side portions of the liner layer, or a lower surface of the lower portion of the nucleation layer is in direct contact with an upper surface of the lower portion of the liner layer, or both.

Clause 8: The device of any of clauses 1-7, wherein the contact extends to below the upper surface of the substrate to be in direct contact with the nucleation layer.

Clause 9: The device of any of clauses 1, 2 and 8, wherein the silicide is in direct contact with the S/D, or wherein the contact is in direct contact with the nucleation layer, or wherein the silicide and the nucleation layer are in direct contact with each other, or any combination thereof.

Clause 10: The device of clause 9, wherein the silicide is 'U' shaped comprising side portions and a lower portion, upper surfaces of the side portions being coplanar with the upper surface of the substrate, and an upper surface of the lower portion being below the upper surface of the substrate, and wherein the nucleation layer is in direct contact with the silicide.

Clause 11: The device of clause 10, wherein the nucleation layer is 'U' shaped conformal to a shape of the silicide, the nucleation layer comprising side portions and a lower portion, and wherein outer surfaces of the side portions of the nucleation layer are in direct contact with inner surfaces of the side portions of the silicide, or a lower surface of the lower portion of the nucleation layer is in direct contact with the upper surface of the lower portion of the silicide, or both.

Clause 12: The device of clause 11, upper surfaces of the side portions of the nucleation layer are coplanar with the upper surface of the substrate.

Clause 13: The device of any of clauses 1-12, wherein the S/D is an epitaxial S/D.

Clause 14: The device of any of clauses 1-13, wherein the silicide is titanium silicide (TiSi).

Clause 15: The device of any of clauses 1-14, wherein the nucleation layer is formed from any one or more of tungsten (W), cobalt (Co), ruthenium (Ru), nickel (Ni), and niobium (Nb).

Clause 16: The device of any of clauses 1-15, wherein the contact is formed from tungsten (W).

Clause 17: The device of any of clauses 1-16, wherein the device is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 18: A method of fabricating a device, the method comprising: forming a source/drain (S/D) in a substrate; forming a silicide in the substrate, the silicide being above and electrically coupled with the S/D; forming a nucleation layer in the substrate, the nucleation layer being above and electrically coupled with the silicide; forming a dielectric on an upper surface of the substrate, the dielectric having a contact well that exposes an upper surface of the nucleation layer; forming sidewall spacers on sides of the dielectric defining the contact well; and forming a contact within the contact well, the contact being in direct contact with the sidewall spacers and electrically coupled with the silicide.

Clause 19: The method of clause 18, wherein the silicide and the nucleation layer are entirely within the substrate.

Clause 20: The method of any of clauses 18-19, further comprising: forming a liner layer in the substrate, the liner layer being between the silicide and the nucleation layer.

Clause 21: The method of clause 20, wherein forming the nucleation layer and forming the liner layer comprise: applying a self-assembled monolayer (SAM) on a spacer formed on upper surfaces and on side surfaces of the dielectric within the contact well; selectively depositing the liner layer on the silicide; selectively depositing the nucleation layer on the liner layer; and removing the SAM.

Clause 22: The method of clause 21, wherein the silicide is 'U' shaped comprising side portions and a lower portion, upper surfaces of the side portions being coplanar with the upper surface of the substrate, and an upper surface of the lower portion being below the upper surface of the substrate, and wherein the liner layer is in direct contact with the silicide.

Clause 23: The method of clause 22, wherein the liner layer is 'U' shaped conformal to a shape of the silicide, the liner layer comprising side portions and a lower portion, and wherein outer surfaces of the side portions of the liner layer are in direct contact with inner surfaces of the side portions of the silicide, or a lower surface of the lower portion of the liner layer is in direct contact with the upper surface of the lower portion of the silicide, or both.

Clause 24: The method of clause 23, wherein the nucleation layer is 'U' shaped conformal to a shape of the liner layer, the nucleation layer comprising side portions and a lower portion, and wherein outer surfaces of the side portions of the nucleation layer are in direct contact with inner surfaces of the side portions of the liner layer, or a lower surface of the lower portion of the nucleation layer is in direct contact with an upper surface of the lower portion of the liner layer, or both.

Clause 25: The method of any of clauses 18-19, wherein forming the nucleation layer comprises: applying a self-assembled monolayer (SAM) on a spacer formed on upper surfaces and on side surfaces of the dielectric within the contact well; selectively depositing the nucleation layer on the silicide; and removing the SAM.

Clause 26: The method of clause 25, wherein the silicide is 'U' shaped comprising side portions and a lower portion, upper surfaces of the side portions being coplanar with the upper surface of the substrate, and an upper surface of the lower portion being below the upper surface of the substrate, and wherein the nucleation layer is in direct contact with the silicide.

Clause 27: The method of clause 26, wherein the nucleation layer is 'U' shaped conformal to a shape of the silicide, the nucleation layer comprising side portions and a lower portion, and wherein outer surfaces of the side portions of the nucleation layer are in direct contact with inner surfaces of the side portions of the silicide, or a lower surface of the lower portion of the nucleation layer is in direct contact with the upper surface of the lower portion of the silicide, or both.

Clause 28: The method of clause 27, upper surfaces of the side portions of the nucleation layer are coplanar with the upper surface of the substrate.

Clause 29: The method of any of clauses 18-28, wherein forming the contact comprises forming the contact through selective chemical vapor deposition.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims-other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A device, comprising:
   a source/drain (S/D) formed in a substrate;
   a silicide formed in the substrate, the silicide being above and electrically coupled with the S/D;
   a nucleation layer formed in the substrate, the nucleation layer being above and electrically coupled with the silicide;
   a dielectric formed on an upper surface of the substrate, the dielectric having a contact well that exposes an upper surface of the nucleation layer;
   sidewall spacers formed on sides of the dielectric defining the contact well; and
   a contact formed within the contact well, the contact being in direct contact with the sidewall spacers and electrically coupled with the silicide.

2. The device of claim 1, wherein the silicide and the nucleation layer are entirely within the substrate.

3. The device of claim 1, further comprising:
   a liner layer formed in the substrate, the liner layer being between the silicide and the nucleation layer.

4. The device of claim 3,
   wherein the silicide is in direct contact with the S/D, or
   wherein the contact is in direct contact with the nucleation layer, or
   wherein the liner layer is in direct contact with one or both of the silicide and the nucleation layer, or
   any combination thereof.

5. The device of claim 4,
   wherein the silicide is 'U' shaped comprising side portions and a lower portion, upper surfaces of the side portions being coplanar with the upper surface of the substrate, and an upper surface of the lower portion being below the upper surface of the substrate, and wherein the liner layer is in direct contact with the silicide.

6. The device of claim 5, wherein the liner layer is 'U' shaped conformal to a shape of the silicide, the liner layer comprising side portions and a lower portion, and wherein outer surfaces of the side portions of the liner layer are in direct contact with inner surfaces of the side portions of the silicide, or a lower surface of the lower portion of the liner layer is in direct contact with the upper surface of the lower portion of the silicide, or both.

7. The device of claim 6, wherein the nucleation layer is 'U' shaped conformal to a shape of the liner layer, the nucleation layer comprising side portions and a lower portion, and wherein outer surfaces of the side portions of the nucleation layer are in direct contact with inner surfaces of the side portions of the liner layer, or a lower surface of the lower portion of the nucleation layer is in direct contact with the upper surface of the lower portion of the liner layer, or both.

8. The device of claim 1, wherein the contact extends to below the upper surface of the substrate to be in direct contact with the nucleation layer.

9. The device of claim 1, wherein the silicide is in direct contact with the S/D, or wherein the contact is in direct contact with the nucleation layer, or wherein the silicide and the nucleation layer are in direct contact with each other, or any combination thereof.

10. The device of claim 9, wherein the silicide is 'U' shaped comprising side portions and a lower portion, upper surfaces of the side portions being coplanar with the upper surface of the substrate, and an upper surface of the lower portion being below the upper surface of the substrate, and wherein the nucleation layer is in direct contact with the silicide.

11. The device of claim 10, wherein the nucleation layer is 'U' shaped conformal to a shape of the silicide, the nucleation layer comprising side portions and a lower portion, and wherein outer surfaces of the side portions of the nucleation layer are in direct contact with inner surfaces of the side portions of the silicide, or a lower surface of the lower portion of the nucleation layer is in direct contact with the upper surface of the lower portion of the silicide, or both.

12. The device of claim 11, upper surfaces of the side portions of the nucleation layer are coplanar with the upper surface of the substrate.

13. The device of claim 1, wherein the S/D is an epitaxial S/D.

14. The device of claim 1, wherein the silicide is titanium silicide (TiSi).

15. The device of claim 1, wherein the nucleation layer is formed from any one or more of tungsten (W), cobalt (Co), ruthenium (Ru), nickel (Ni), and niobium (Nb).

16. The device of claim 1, wherein the contact is formed from tungsten (W).

17. The device of claim 1, wherein the device is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

18. A method of fabricating a device, the method comprising:

forming a source/drain (S/D) in a substrate;

forming a silicide in the substrate, the silicide being above and electrically coupled with the S/D;

forming a nucleation layer in the substrate, the nucleation layer being above and electrically coupled with the silicide;

forming a dielectric on an upper surface of the substrate, the dielectric having a contact well that exposes an upper surface of the nucleation layer;

forming sidewall spacers on sides of the dielectric defining the contact well; and forming a contact within the contact well, the contact being in direct contact with the sidewall spacers and electrically coupled with the silicide.

19. The method of claim 18, wherein the silicide and the nucleation layer are entirely within the substrate.

20. The method of claim 18, further comprising:

forming a liner layer in the substrate, the liner layer being between the silicide and the nucleation layer.

21. The method of claim 20, wherein forming the nucleation layer and forming the liner layer comprise:

applying a self-assembled monolayer (SAM) on a spacer formed on upper surfaces and on side surfaces of the dielectric within the contact well;

selectively depositing the liner layer on the silicide;

selectively depositing the nucleation layer on the liner layer; and removing the SAM.

22. The method of claim 21, wherein the silicide is 'U' shaped comprising side portions and a lower portion, upper surfaces of the side portions being coplanar with the upper surface of the substrate, and an upper surface of the lower portion being below the upper surface of the substrate, and wherein the liner layer is in direct contact with the silicide.

23. The method of claim 22, wherein the liner layer is 'U' shaped conformal to a shape of the silicide, the liner layer comprising side portions and a lower portion, and wherein outer surfaces of the side portions of the liner layer are in direct contact with inner surfaces of the side portions of the silicide, or a lower surface of the lower portion of the liner layer is in direct contact with the upper surface of the lower portion of the silicide, or both.

24. The method of claim 23,
wherein the nucleation layer is 'U' shaped conformal to a shape of the liner layer, the nucleation layer comprising side portions and a lower portion, and
wherein
outer surfaces of the side portions of the nucleation layer are in direct contact with inner surfaces of the side portions of the liner layer, or
a lower surface of the lower portion of the nucleation layer is in direct contact with the upper surface of the lower portion of the liner layer, or
both.

25. The method of claim 18, wherein forming the nucleation layer comprises:
applying a self-assembled monolayer (SAM) on a spacer formed on upper surfaces and on side surfaces of the dielectric within the contact well;
selectively depositing the nucleation layer on the silicide; and
removing the SAM.

26. The method of claim 25,
wherein the silicide is 'U' shaped comprising side portions and a lower portion, upper surfaces of the side portions being coplanar with the upper surface of the substrate, and an upper surface of the lower portion being below the upper surface of the substrate, and
wherein the nucleation layer is in direct contact with the silicide.

27. The method of claim 26,
wherein the nucleation layer is 'U' shaped conformal to a shape of the silicide, the nucleation layer comprising side portions and a lower portion, and
wherein
outer surfaces of the side portions of the nucleation layer are in direct contact with inner surfaces of the side portions of the silicide, or
a lower surface of the lower portion of the nucleation layer is in direct contact with the upper surface of the lower portion of the silicide, or
both.

28. The method of claim 27, upper surfaces of the side portions of the nucleation layer are coplanar with the upper surface of the substrate.

29. The method of claim 18, wherein forming the contact comprises forming the contact through atomic layer deposition.

* * * * *